United States Patent
Jasa et al.

(10) Patent No.: US 7,064,622 B2
(45) Date of Patent: Jun. 20, 2006

(54) DUAL DIFFERENTIAL LC VOLTAGE-CONTROLLED OSCILLATOR

(75) Inventors: Hrvoje Jasa, Scarborough, ME (US); Gary D. Polhemus, Sebago, ME (US); John E. Scoggins, Dover, NH (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/811,556

(22) Filed: Mar. 29, 2004

(65) Prior Publication Data

US 2005/0212609 A1   Sep. 29, 2005

(51) Int. Cl.
*H03B 5/12* (2006.01)
(52) U.S. Cl. ................... 331/117 R; 331/36 C
(58) Field of Classification Search ............ 331/117 R, 331/117 FE, 177 V, 36 C
See application file for complete search history.

(56) References Cited

U.S. PATENT DOCUMENTS

| | | | |
|---|---|---|---|
| 6,016,082 A * | 1/2000 | Cruz et al. ............. | 331/117 FE |
| 6,292,065 B1 * | 9/2001 | Friedman et al. ....... | 331/117 R |
| 6,469,587 B1 | 10/2002 | Scoggins ................ | 331/117 R |
| 6,784,753 B1 * | 8/2004 | Leenaerts et al. ......... | 331/36 C |

* cited by examiner

*Primary Examiner*—Joseph Chang

(57) ABSTRACT

A differential voltage-controlled oscillator (VCO) employs at least two pairs of varactors, each pair of varactors driven with a corresponding differential control voltage, to generate a differential oscillating waveform. The capacitance of each pair of varactors adds to form the total capacitance of an inductor-capacitor (LC) tank circuit of the VCO, which determines an oscillation frequency of the differential oscillating waveform of the VCO. One differential control voltage controls a capacitance of the first varactor pair for a relatively coarse adjustment of the oscillation frequency, and the other differential control voltage controls a capacitance of the second varactor pair for a relatively fine adjustment of the oscillation frequency.

15 Claims, 5 Drawing Sheets

DUAL DIFFERENTIAL LC VOLTAGE-CONTROLLED OSCILLATOR

BACKGROUND OF THE INVENTION

1. Field of the Invention

The present invention relates to electronic circuits, and, in particular, to signal generators such as voltage-controlled oscillator circuits.

2. Description of the Related Art

For many electronic applications, an oscillator circuit is employed to generate a periodic oscillating waveform. An oscillator circuit may be implemented with a tuned amplifier having positive feedback from the amplifier's output terminal to its input terminal, which design takes advantage of the instability possible in circuits having such a feedback loop. Oscillator circuits are designed with instability such that there is a frequency at which the loop gain is real and greater than one. Once drive voltage and current are applied to the circuit, the oscillator output signal oscillates between the maximum and minimum values of the amplifier output, thus generating the periodic output signal having a frequency related to the loop gain. Since a tuned amplifier is employed, the oscillator's loop-gain frequency is, to a great extent, determined by the inductance (L) and capacitance (C) values used to tune the amplifier (i.e., the "tank" circuit). A voltage-controlled oscillator (VCO) is a circuit that generates a periodic output signal with frequency based on an input voltage level. In some VCOs, a varactor diode is employed since the space-charge capacitance of the varactor changes as a function of control voltage (e.g., reverse biasing voltage), thus changing the capacitance of the tank circuit. Many different circuit configurations are known in the art to implement a VCO.

As VCO output frequencies increase for radio frequency (RF) applications (e.g., above 1 GHz), many prior-art VCOs implemented within an integrated circuit (IC) employ an accumulation-mode varactor. For example, a common n-well structure for an accumulation-mode varactor may be an n-channel MOS FET fabricated in an n-well (or a p-channel MOS FET fabricated in a p-well). Alternatively, the accumulation-mode varactor may be a common n-well bi-polar transistor. The capacitance of the accumulation-mode varactor is formed from the combined capacitance of the oxide layer and depletion layer. The capacitance of the accumulation-mode varactor changes as the reverse bias voltage applied across the varactor changes the varactor's state between deep accumulation and strong depletion of charge in the semiconductor layers.

VCO circuits commonly employed in the prior art comprise a single-ended control voltage ($V_C$) drive circuit to provide the varying bias voltage across the varactor. Such single-ended control voltage is applied to one terminal of the varactor, while the other terminal is generally coupled to a supply voltage ($V_{DD}$) or AC-coupled through an inductor or capacitor to $V_{DD}$. The single-ended control voltage sets the variable capacitance of the varactor. Setting the variable capacitance of the varactor, in turn, tunes the LC-tank circuit to the desired operating frequency f.

FIG. 1 shows an integrated differential LC-VCO 100 of the prior art as may be implemented within an integrated circuit and operating with an output frequency above 1 GHz. In LC-VCO 100, two accumulation-mode varactors 101 and 102 are coupled back-to back in a common n-well configuration, the common n-wells of varactors 101 and 102 driven at node N1 by the DC control voltage $V_C$. The other terminal of each of varactors 101 and 102 (shown at nodes N2 and N3, respectively) is coupled through a corresponding resistor R to the supply voltage $V_{DD}$. For LC-VCO 100 of FIG. 1, the output voltages at corresponding terminals of varactors 101 and 102 (at nodes N2 and N3) are AC-coupled through capacitors 104 and 105 to nodes N4 and N5 as output voltages $V_O-$ and $V_O+$. One skilled in the art would recognize that the output voltages from varactors 101 and 102 do not necessarily have to be AC-coupled. Inductors 106 and 107 are coupled between 1) corresponding nodes N4 and N5 and 2) the supply voltage $V_{DD}$. Inductors 106 and 107 may be coupled directly between the supply voltage $V_{DD}$ and nodes N2 and N3 if the output voltages $V_O-$ and $V_O+$ are not AC-coupled.

Output voltages $V_O+$ and $V_O-$ are driven through a differential amplifier formed from cross-coupled MOS FETs M1 108 and M2 109, with M1 108 and M2 109 biased, as known in the art, via the current mirror of MOS FET M3 110, MOS FET M4 111, and current source 112. Positive feedback for the differential amplifier is generally through the LC-tank formed between nodes N4, N5, and $V_{DD}$. The resonant frequency f of LC-VCO 100 is determined by the LC-tank circuit (i.e., $f=1/(2\pi\sqrt{LC})$). For the LC-tank, L is the inductance of the circuit generated from the combination of inductors 106 and 107, and C is the capacitance formed from the combination of 1) the varying capacitances of varactors 101 and 102, 2) the capacitances of capacitors 104 and 105, 3) the capacitances of the differential cross-coupled MOS FETs M1 108 and M2 109, and 4) various IC parasitic capacitances.

The single-ended control voltage (e.g., $V_C$ of FIG. 1) sets the variable capacitances of the varactors. However, use of a single-ended control voltage drive circuit provides poor common-mode noise rejection. One approach is to increase common-mode noise rejection with AC-coupling of the output voltages, such as described with respect to FIG. 1. AC-coupling adds capacitance, which reduces the amplitude of the oscillation waveform across the varactor by the capacitance divider ratio. Therefore, AC-coupling reduces phase noise effects in output voltages at the expense of lower frequency-tuning range and lower VCO gain. This, and related techniques for improving common-mode noise rejection, are described in greater detail in F. Svelto and R. Castello, "A 1.3 GHz Low-Phase Noise Fully Tunable CMOS LC VCO", IEEE Journal on Solid State Circuits, Vol. 35, No. 3, March 2000, incorporated herein by reference.

In addition, accumulation-mode varactors have a voltage-capacitance curve in which a majority of the variation in capacitance occurs between −1 to +1 volts of change in bias voltage across the varactor. However, bias of the varactor with a single-ended control voltage might not vary capacitance over the entire voltage-capacitance curve. As illustrated in FIG. 1, prior-art differential LC-VCO circuits connect one side of each varactor (shown at nodes N4 and N5) directly to a terminal of the inductor which sets the DC bias point of the varactor to the DC value appearing at the other terminal of the inductor, which DC value is often the positive power supply $V_{DD}$. Thus, prior art VCOs either i) utilize only half of the variable capacitance range of each varactor or ii) employ additional circuitry that allows for driving the varactors above and below the DC bias point.

One method of employing the entire capacitance range of each varactor is described in U.S. Pat. No. 6,469,587, entitled "Differential LC Voltage-Controlled Oscillator," filed on Dec. 4, 2000, to Scoggins, which is incorporated herein by reference. Scoggins describes a voltage-controlled oscillator (VCO) that includes a pair of varactors that are coupled in a back-to-back configuration and that are driven by a differential control voltage having positive and complementary control-voltage components to generate an output oscillation waveform. A voltage converter is employed to amplify and shift the positive and complementary control voltage components, with respect to a VCO source voltage, to generate the intermediate differential control voltage. The output signal of the VCO is tuned, in frequency, by setting a VCO tank inductance and varying a VCO tank capacitance in accordance with the intermediate differential control voltage. The VCO LC-tank capacitance includes the capacitance of the back-to-back varactors that varies in accordance with a drive voltage across each varactor. The drive voltage is formed from the intermediate control voltage by applying one of the intermediate control-voltage components to the node formed where the corresponding back-to-back varactors are coupled, and by applying the other intermediate control-voltage component to a node to which the other terminal of each varactor is coupled.

SUMMARY OF THE INVENTION

In accordance with embodiments of the present invention, a differential voltage-controlled oscillator (VCO) employs two pairs of varactors, each pair of varactors driven with a corresponding differential control voltage, to generate a differential oscillating waveform. The capacitance of each pair of varactors adds to form the total capacitance of an inductor-capacitor (LC) tank circuit of the VCO, which determines an oscillation frequency of the differential oscillating waveform of the VCO. One differential control voltage controls a capacitance of the first varactor pair for a relatively coarse adjustment of the oscillation frequency, and the other differential control voltage controls a capacitance of the second varactor pair for a relatively fine adjustment of the oscillation frequency.

In accordance with an exemplary embodiment of the present invention, a circuit has a differential amplifier and an inductor-capacitor (LC) tank. The differential amplifier has a differential input terminal pair and a differential output terminal pair, wherein the differential amplifier provides a differential oscillating signal at the differential output terminal pair. The (LC) tank is coupled between the differential input and output terminal pairs, wherein the LC tank includes an inductive element coupled in parallel with a capacitive element. The capacitive element includes a first and a second varactor pair. The first varactor pair is coupled to receive a first differential control voltage, the first control voltage i) setting a capacitance of each varactor of the first varactor pair and ii) providing a first level of adjustment to an oscillation frequency of the oscillating signal. The second varactor pair is coupled to receive a second differential control voltage, the second control voltage i) setting a capacitance of each varactor of the second varactor pair and ii) providing a second level of adjustment to the oscillation frequency of the oscillating signal, wherein the first and second levels of adjustment are different.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
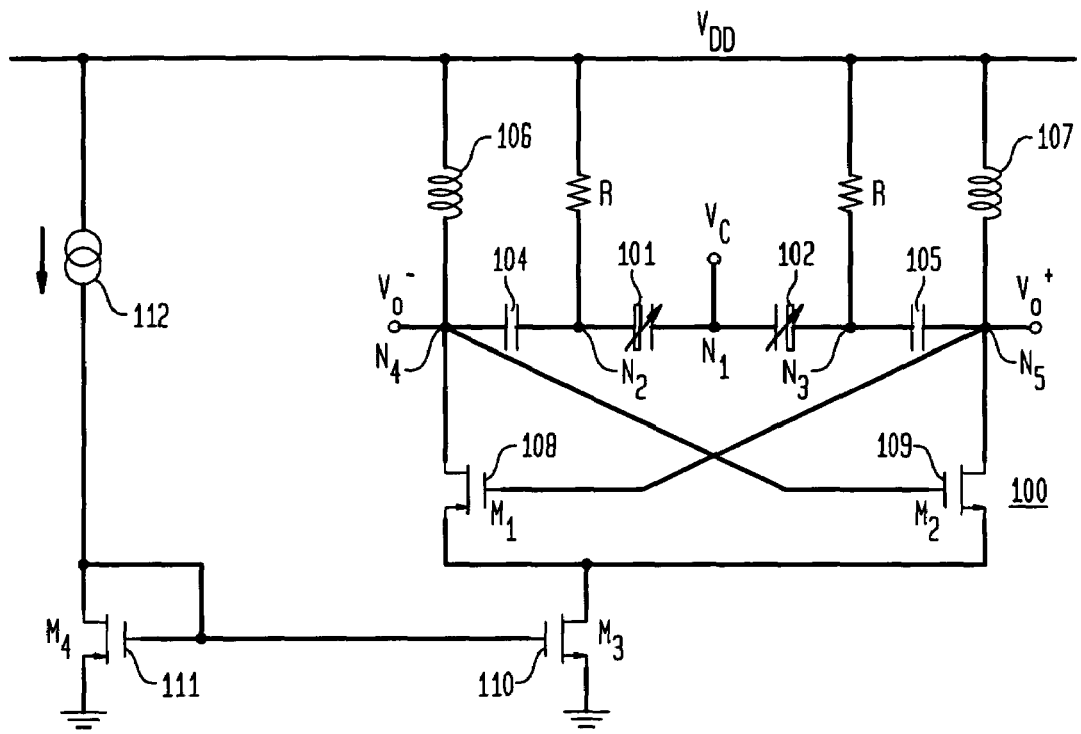
FIG. 1 shows an integrated differential LC voltage-controlled oscillator (VCO) of the prior art employing accumulation-mode varactors and operating with an output frequency above 1 GHz.
Figure 2:
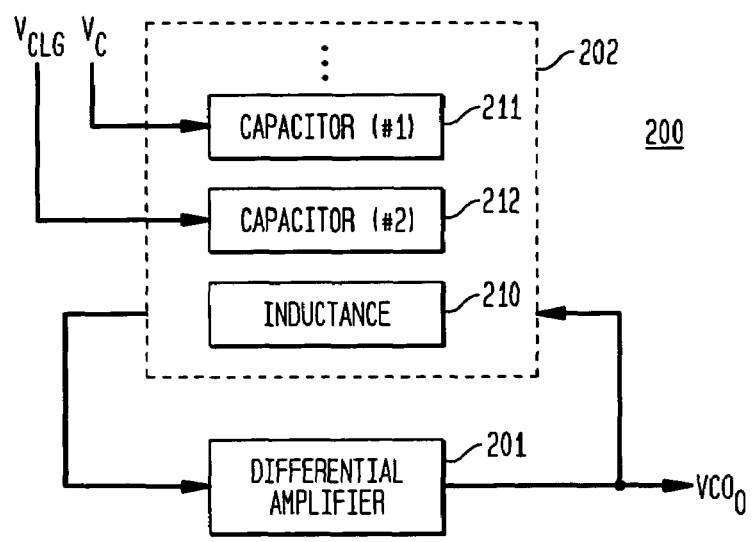
FIG. 2 shows a block diagram of an exemplary VCO circuit in accordance with an embodiment of the present invention.

FIG. 2 shows a block diagram of voltage-controlled oscillator (VCO) circuit 200 in accordance with an exemplary embodiment of the present invention. VCO 200 employs differential amplifier 201 and inductor-capacitor (LC) tank 202. LC tank 202 is differentially coupled between the output and input terminals of differential amplifier 201 to generate differential oscillating output signal $VCO_O$ at a desired frequency of oscillation.

As is known in the art, an amplifier having its output coupled to its input through an LC tank circuit oscillates at a given frequency determined by the impedance of the LC tank circuit. The impedance of the LC tank circuit is a function of the inductance and capacitance of the LC tank circuit.

LC tank 202 comprises inductor 210 and at least two capacitors 211 and 212, where inductor 210 and capacitors 211 and 212 are coupled in parallel. Inductor 210 and capacitors 211 and 212 are differentially coupled to output signal $VCO_O$ and to the input of differential amplifier 201. The capacitance of capacitors 211 and 212 adds to form the total capacitance of LC tank of VCO 200, which determines an oscillation frequency of the differential oscillating waveform of VCO 200 for a given value of inductance for inductor 210. Each of capacitors 210 and 211 includes a pair of varactors.

Capacitor 211 is driven with a differential control voltage $V_C$ that sets the value of the capacitance of capacitor 211. Similarly, capacitor 212 is driven with a differential control voltage $V_{CLG}$ that sets the value of the capacitance of capacitor 212. Differential control voltage $V_C$ controls the capacitance of the varactor pair of capacitor 211 for a relatively coarse control of the oscillation frequency (e.g., sets the oscillation frequency within ±10% of the center frequency of VCO 200). Differential control voltage $V_{CLG}$ controls the capacitance of the varactor pair of capacitor 212 for a relatively fine control of the oscillation frequency (e.g., sets the oscillation frequency within ±1% of the center frequency of VCO 200).

Figure 3:
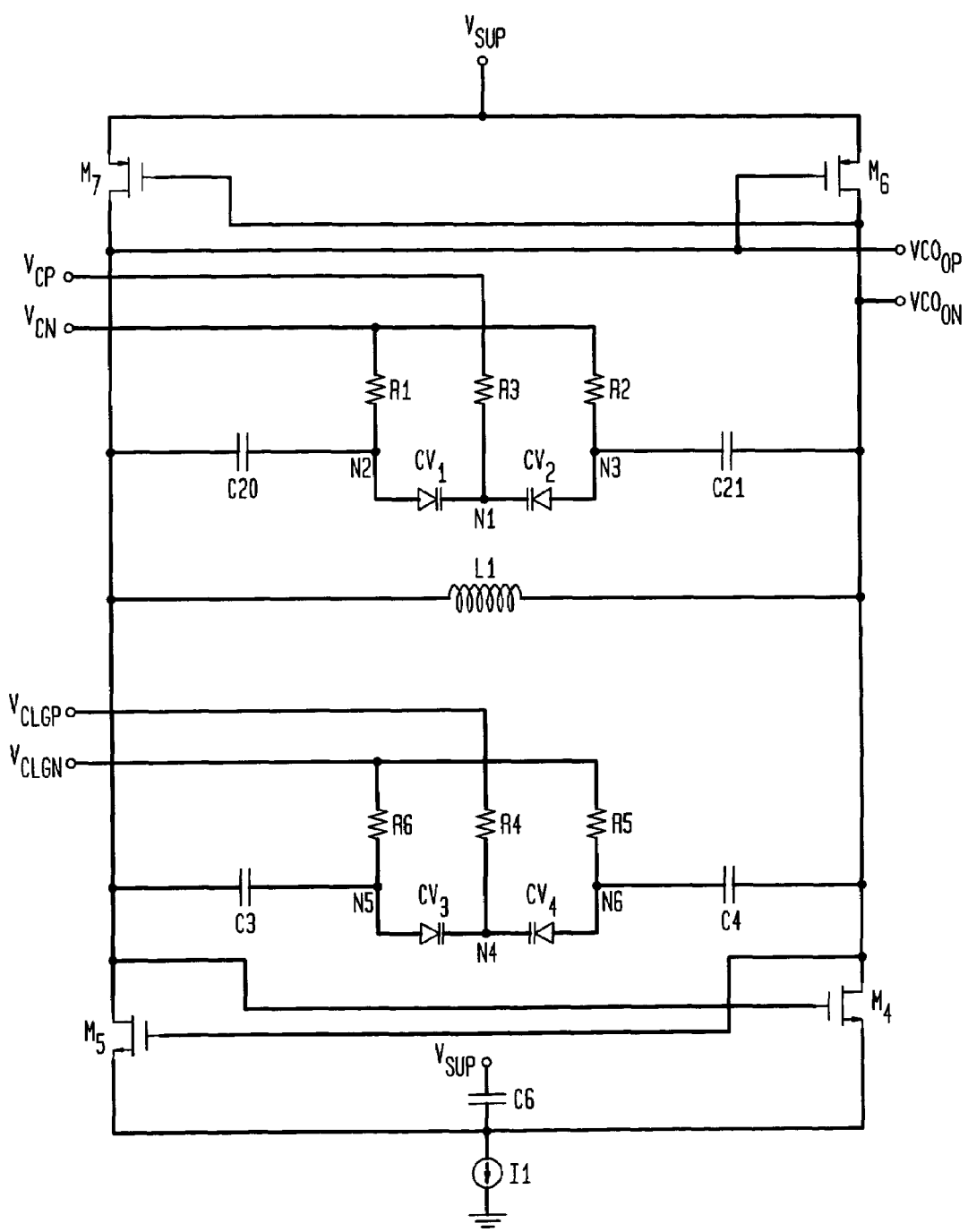
FIG. 3 shows a circuit diagram of an implementation of the exemplary VCO shown in FIG. 2.

FIG. 3 shows a diagram of an exemplary circuit for VCO 200 shown in FIG. 3. The exemplary circuit of FIG. 3 is shown coupled between a voltage potential defined by supply voltage $V_{SUP}$ and ground, though one skilled in the art might select a different voltage potential with which to bias the circuit. Differential control voltage $V_C$ is shown as voltage pair $V_{CP}$ and $V_{CN}$, differential control voltage $V_{CLG}$ is shown as voltage pair $V_{CLGP}$ and $V_{CLGN}$, and differential oscillating output signal $VCO_O$ is shown as output signal pair $VCO_{OP}$ and $VCO_{ON}$.

Differential amplifier 201 of FIG. 2 is shown in FIG. 3 comprising field effect transistors (FETs) M4, M5, M6, and M7 and current source I1. FETs M7 and MS are coupled to form a first inverter, FETs M6 and M4 are coupled to form a second inverter, and the first and second inverters are coupled back-to-back to form a differential amplifier biased by current source I1. One skilled in the art might employ different circuits other than back-to-back inverters to implement the differential amplifier. A given implementation for VCO 200, however, includes capacitance effects of the differential amplifier when determining the capacitance of the LC tank 202 for a desired oscillation frequency.

Inductor 210 of LC tank 202 of FIG. 2 is shown in FIG. 3 as inductor L1 coupled across output signal pair $VCO_{OP}$ and $VCO_{ON}$. Other embodiments might employ two inductors, with a first inductor having one terminal coupled to $VCO_{OP}$ and the other terminal coupled to supply voltage $V_{SUP}$, and with a second inductor having one terminal coupled to $VCO_{ON}$ and the other terminal coupled to supply voltage $V_{SUP}$.

Capacitor 211 of LC tank 202 of FIG. 2 is shown in FIG. 3 comprising a first varactor pair with accumulation-mode varactors CV1 and CV2, capacitors C20 and C21, and resistors R1, R2, and R3. Accumulation-mode varactors CV1 and CV2 are coupled back-to back within a common n-well configuration at node N1. The common n-well terminal of varactors CV1 and CV2 is driven through resistor R3 by the positive varactor control voltage $V_{CP}$ of differential control voltage $V_C$. The other terminal of each of varactors CV1 and CV2 (shown at nodes N2 and N3, respectively) is coupled through a corresponding resistor (R1 and R2, respectively) to the complement varactor control voltage $V_{CN}$ of differential control voltage $V_C$. The capacitance of each of the accumulation-mode varactors CV1 and CV2 is set via the differential control voltage $V_C$.

Capacitor C20 is coupled between varactor CV1 (at node N2) and output signal $VCO_{OP}$, and capacitor C21 is coupled between varactor CV2 (at node N3) and output signal $VCO_{ON}$. Consequently, capacitor 211 is coupled between output signal pair $VCO_{OP}$ and $VCO_{ON}$ and, thus, capacitor 211 is AC-coupled between the input and output terminals of differential amplifier 201. A given implementation for VCO 200 includes the capacitance effects of capacitors C20 and C21 when determining the capacitance of LC tank 202 for a desired oscillation frequency.

Similarly, capacitor 212 of LC tank 202 of FIG. 2 is shown in FIG. 3 comprising a second varactor pair with accumulation-mode varactors CV3 and CV4, capacitors C3 and C4, and resistors R4, R5, and R6. Accumulation-mode varactors CV3 and CV4 are coupled back-to back within a common n-well configuration at node N4. The common n-well terminal of varactors CV3 and CV4 is driven through resistor R4 by the positive varactor control voltage $V_{CLGP}$ of differential control voltage $V_{CLG}$. The other terminal of each of varactors CV3 and CV4 (shown at nodes N5 and N6, respectively) is coupled through a corresponding resistor (R6 and R5, respectively) to the complement varactor control voltage $V_{CLGN}$ of differential control voltage $V_{CLG}$. The capacitance of each of the accumulation-mode varactors CV3 and CV4 is set via the differential control voltage $V_{CLG}$.

Capacitor C3 is coupled between varactor CV3 (at node N5) and output signal $VCO_{OP}$, and capacitor C4 is coupled between varactor CV4 (at node N6) and output signal $VCO_{ON}$. Consequently, capacitor 212 is coupled between output signal pair $VCO_{OP}$ and $VCO_{ON}$ and, thus, capacitor 212 is AC-coupled between the input and output terminals of differential amplifier 201. A given implementation for VCO 200 includes the capacitance effects of capacitors C3 and C4 when determining the capacitance of the LC tank 202 for a desired oscillation frequency.

Capacitor C6 of FIG. 3 is employed by differential amplifier 201 to attenuate second-harmonic oscillation signals of differential oscillating output signal $VCO_O$ at a desired frequency of oscillation.

Current source I1 of FIG. 3 might typically bias the differential amplifier with a current of 1 mA, and might reach a maximum value of 2 mA. For the exemplary circuit of FIG. 3, the maximum capacitance of either varactor CV3 or CV4 (for fine adjustment of frequency) is approximately one tenth or less the maximum capacitance of either varactor CV1 or CV2 (for coarse adjustment of frequency). Table 1 shows an exemplary set of component values for the circuit of FIG. 3:

TABLE 1

| Component | Value | Component | Value |
|---|---|---|---|
| CV1 | 900 fF max | L1 | 3100 pH |
| CV2 | 900 fF max | R1 | 10 Kohm |
| CV3 | 60 fF max | R2 | 10 Kohm |
| CV4 | 60 fF max | R3 | 10 Kohm |
| C20 | 1000 fF | R4 | 5 Kohm |
| C21 | 1000 fF | R5 | 5 Kohm |
| C3 | 100 fF | R6 | 5 Kohm |
| C4 | 100 fF | C6 | 10 pF |

In Table 1, "fF" is femtoFarad, "pF" is picoFarad, and "pH" is picoHenry.

As is known in the art, the resonant frequency f of the VCO of FIG. 3 is determined by the LC tank (i.e., $f=1/(2\pi \sqrt{L_{TOTAL}C_{TOTAL}})$). For LC tank 202 of VCO 200 in accordance with the present invention, $L_{TOTAL}$ is generally the inductance of inductor L1 shown in FIG. 3, although the value of $L_{TOTAL}$ may be influenced by the inductance of other integrated circuit (IC) components and wire bonding. For LC tank 202 of VCO 200, the value for $C_{TOTAL}$ is generally more difficult to calculate expressly, since the value for $C_{TOTAL}$ is not only the combination of the capacitance of the varactors and capacitors themselves, but also the capacitances added by the transistors and other parasitic IC device capacitances. For the circuit shown in FIG. 3, tank inductance $L_{TOTAL}$ may be approximated as given in equation (1), and tank capacitance may be approximated as $C_{TOTAL}$ given in equation (2):

$$L=L1, \quad (1)$$

$$C_{total}=(A+B+C), \quad (2)$$

where A, B, and C are as given in equations (3), (4), and (5):

$$A=((CV1*C20)/(CV1+C20))*0.5 \quad (3)$$

$$B=((CV3*C3)/(CV3+C3))*0.5 \quad (4)$$

$$C=(\text{Gate Ox capacitances of } M4, M5, M6, M7,+ \text{ device parasitic capacitances} \quad (5)$$

For the exemplary implementation of FIG. 3 with circuit components as given in Table 1, the capacitance may vary over frequency, temperature, and manufacturing process. Minimum (min), maximum (max), and mid-range values for the frequency of oscillation for high-gain (hg) and low-gain (ig) differential control voltages are given in Table 2:

TABLE 2 fminhg = 4.4556 GHz
fmidhg = 4.97664 GHz
fmaxhg = 5.5364 GHz
fminlg = 4.9232 GHz
fmidlg = 4.97664 GHz
fmaxlg = 5.0150 GHz In Table 2, the values of high-gain frequency are provided when the low-gain differential control voltage is set for frequency at a minimum, and the values of low-gain frequency are provided when high-gain differential control voltage is set for frequency at a minimum.

Figure 4:
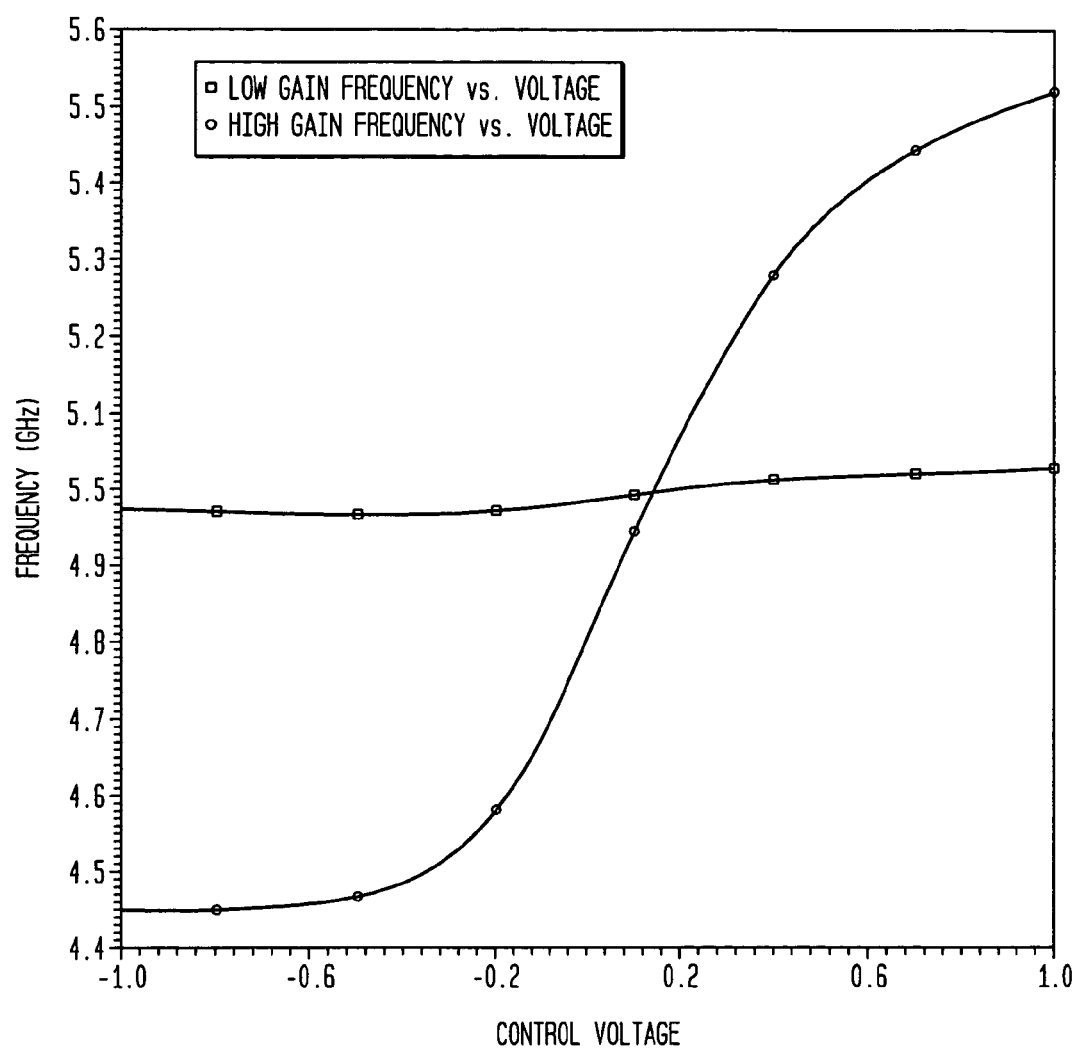
FIG. 4 shows a graph of VCO frequency versus high-gain and low-gain differential control voltage for the exemplary circuit of FIG. 3.
Figure 5:
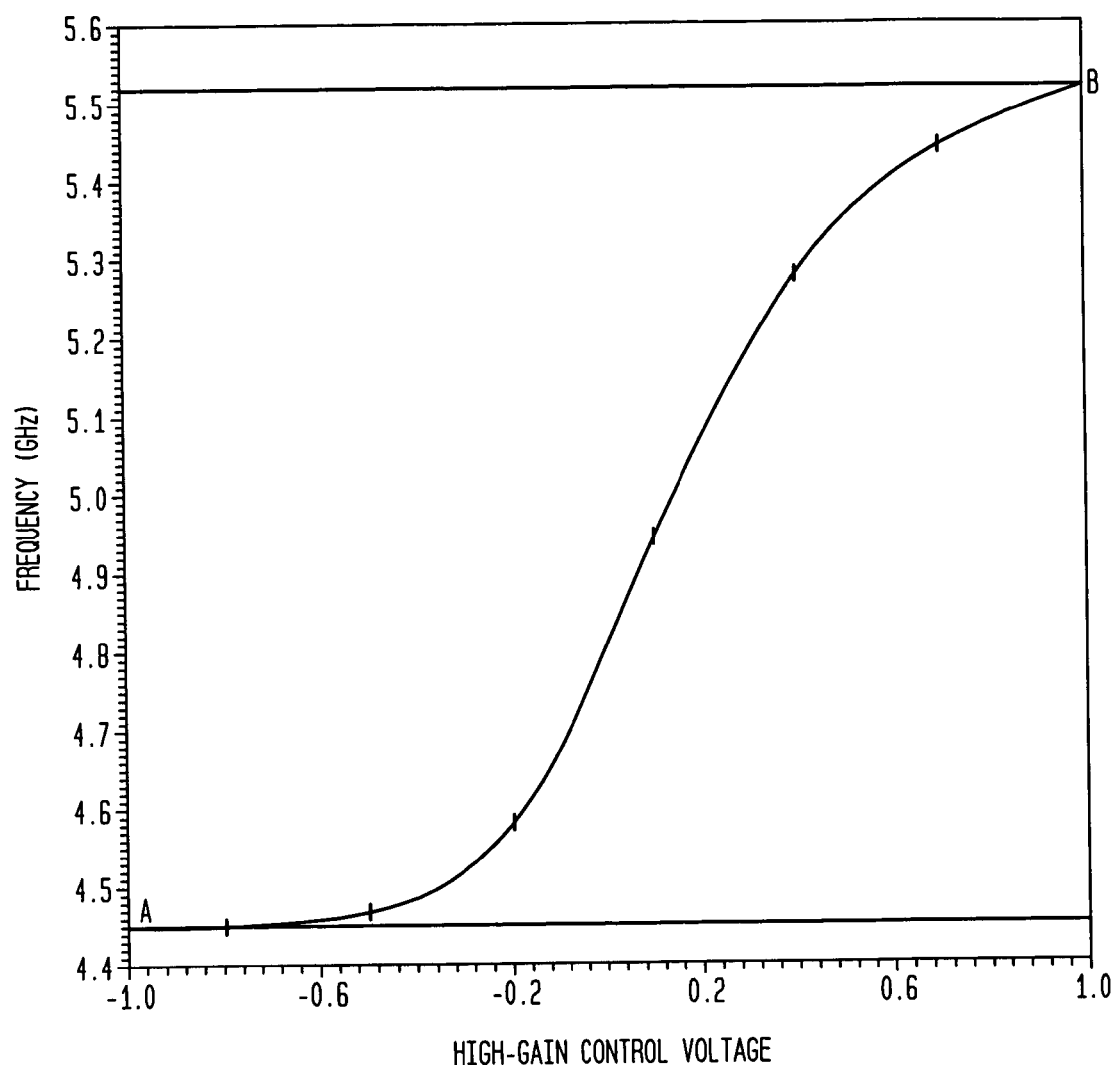
FIG. 5 shows a graph of VCO frequency versus high-gain differential control voltage for the exemplary circuit of FIG. 3.
Figure 6:
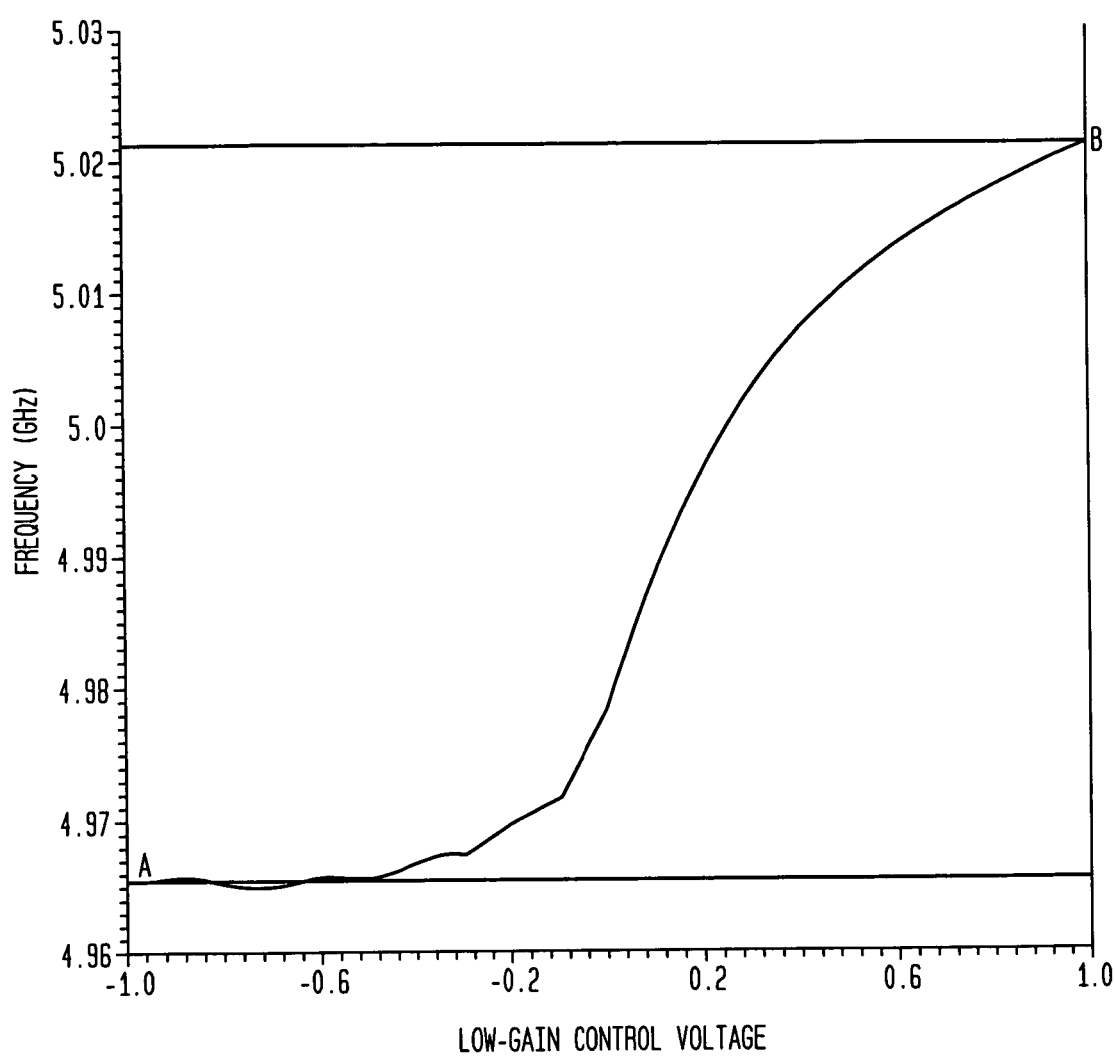
FIG. 6 shows a graph of VCO frequency versus low-gain differential control voltage for the exemplary circuit of FIG. 3.

The operation of the exemplary circuit of FIG. 3 might be simulated for an exemplary operating temperature of 27° C. and a 1.2-volt supply voltage. FIG. 4 shows a graph of VCO frequency versus high-gain and low-gain differential control voltage for the exemplary circuit of FIG. 3. FIG. 5 shows a graph of VCO frequency versus high-gain differential control voltage for the exemplary circuit of FIG. 3. FIG. 6 shows a graph of VCO frequency versus low-gain differential control voltage for the exemplary circuit of FIG. 3. In FIGS. 4, 5, and 6, the control voltage is shown varying from −1.0 volts to +1.0 volts.

While the exemplary embodiments of the present invention have been described with respect to particular circuit components, one skilled in the art would realize that the present invention might be embodied in many different circuit configurations. For example, where FET transistors are shown and described, other similar components, such as bi-polar transistors, may be selected in the alternative. In particular, while the present invention is described for accumulation-mode varactors, one skilled in the art would realize that other types of varactors or similar devices may be employed. Consequently, for the present invention, a varactor may be any device that exhibits a change in device capacitance based on a biasing voltage. For example, other types of varactors include: a) depletion-mode NMOS varactors, b) bipolar Base-Emitter Junction varactors, c) bipolar Base-Collector Junction varactors, d) P+ to Ntub Junction varactors, and e) N+ to Ptub Junction varactors.

In addition, the present invention is not limited to the two pairs of varactors and corresponding control voltages as shown. For example, the present invention might extend to more than two pairs of varactors with corresponding control voltages in accordance with the teachings herein. Each varactor pair might be employed to control a corresponding portion of the capacitance of the LC tank circuit. For example, a first varactor pair might be used to coarsely set the frequency of oscillation of the VCO when the oscillation is programmable, a second varactor pair might be used to finely adjust the frequency of oscillation in response to the feedback phase error of a phase-locked loop employing the VCO, and a third varactor pair might be employed to adjust the frequency of oscillation in response to temperature or other process variations. The selection of the number of different varactor pairs and corresponding control voltages might be influenced by the relative speed of circuit variations that affect the oscillation frequency of the VCO output signal.

The present invention is not limited to the types of circuit configurations shown. For example, the present invention describes a particular circuit, but one skilled in the art would recognize that many different variant circuits of the exemplary embodiment described herein may accomplish a similar result. In addition, the present invention is described with respect to AC-coupling of the various control voltages and differential oscillating waveform with capacitors, but such AC-coupling may or may not be employed in other configurations. Also, the circuit component values are exemplary only, and particular values and additional components may be selected for higher or lower desired frequency of differential oscillating waveform.

A dual differential VCO operating in accordance with one or more embodiments of the present invention may provide the following advantages. First, having at least two different control voltages allows for coarse and fine adjustment of operating frequency to provide higher precision in setting the output frequency of the VCO. Second, having at least two different control voltages allows for at least two different feedback control voltages in, for example, a PLL or delay-locked loop (DLL), where each feedback control voltage is employed to correct for frequency variations caused by differing rates of change.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A circuit comprising:
a differential amplifier having a differential input terminal pair and a differential output terminal pair, wherein the differential amplifier provides a differential oscillating signal at the differential output terminal pair; and
an inductor-capacitor (LC) tank coupled between the differential input and output terminal pairs, wherein the LC tank comprises an inductive element coupled in parallel with a capacitive element, wherein the capacitive element comprises:
a first varactor pair coupled to receive a first differential control voltage, wherein the first differential control voltage i) sets a capacitance of each varactor of the first varactor pair and ii) provides a first level of adjustment to an oscillation frequency of the oscillating signal, and
a second varactor pair coupled to receive a second differential control voltage, wherein the second differential control voltage i) sets a capacitance of each varactor of the second varactor pair and ii) provides a second level of adjustment to the oscillation frequency of the oscillating signal, wherein the first and second levels of adjustment are different.

2. The invention as recited in claim 1, wherein the capacitive element is AC-coupled between the differential input and output terminal pairs.

3. The invention as recited in claim 1, wherein the differential amplifier comprises a set of cross-coupled transistors.

4. The invention as recited in claim 3, wherein the set of cross-coupled transistors is configured as a pair of back-to-back inverters.

5. The invention as recited in claim 1, wherein each of the first and second pairs of varactors are configured as back-to-back varactors.

6. The invention as recited in claim 1, wherein the circuit is a voltage-controlled oscillator (VCO).

7. The invention as recited in claim 6, wherein the VCO is employed in a phase-locked loop (PLL) circuit, the first differential control voltage represents a feedback error for process variations of the PLL circuit, and the second differential control voltage represents a feedback phase error of the PLL circuit.

8. The invention as recited in claim 1, further comprising at least one other pair of varactors, each of the at least one other pair of varactors coupled to receive a corresponding differential control voltage to i) set a capacitance of each varactor of the at least one other varactor pair and ii) provide a corresponding level of adjustment to the oscillation frequency of the oscillating signal.

9. The invention as recited in claim 1, further comprising a filter, coupled between a source voltage and the differential output terminal pair of the differential amplifier, the filter adapted to filter one or more harmonics of the oscillation frequency.

10. The invention as recited in claim 1, wherein the circuit is embodied in an integrated circuit.

11. A circuit comprising:
an amplifier having an input terminal and an output terminal, wherein the amplifier is configured to i) amplify a signal at the input terminal and ii) provide an oscillating signal at the output terminal; and
an impedance element having an inductive element and a capacitive element, the impedance element coupled between the input terminal and the output terminal of the amplifier, wherein the capacitive element comprises:
a first variable capacitor coupled to receive a first differential control voltage, the first differential control voltage i) setting a capacitance of the first variable capacitor and ii) providing a first level of adjustment to an oscillation frequency of the oscillating signal, and
a second variable capacitor coupled to receive a second differential control voltage, the second differential control voltage i) setting a capacitance of the second capacitor and ii) providing a second level of adjustment to the oscillation frequency of the oscillating signal, wherein the first and second levels of adjustment are different.

12. The invention as recited in claim 11, wherein the circuit is a voltage-controlled oscillator (VCO).

13. The invention as recited in claim 12, wherein the VCO is employed in a phase-locked loop (PLL) circuit, the first differential control voltage represents a feedback error for process variations of the PLL circuit, and the second differential control voltage represents a feedback phase error of the PLL circuit.

14. The invention as recited in claim 11, further comprising at least one other variable capacitor, each of the at least one other variable capacitors coupled to receive a corresponding control voltage to i) set a capacitance of the at least one other variable capacitor and ii) provide a corresponding level of adjustment to the oscillation frequency of the oscillating signal.

15. Apparatus for generating an oscillating signal, the apparatus comprising:
an amplifier having an input terminal and an output terminal, wherein the amplifier provides a differential oscillating signal at the output terminal; and
an inductor-capacitor (LC) tank coupled between the input terminal and the output terminal of the amplifier, wherein the LC tank comprises an inductive element coupled in parallel with a capacitive element, and wherein the capacitive element comprises:
a first varactor pair coupled to receive a first differential control voltage, wherein the first differential control voltage i) sets a capacitance of each varactor of the first varactor pair and ii) provides a first level of adjustment to an oscillation frequency of the oscillating signal, and
a second varactor pair coupled to receive a second differential control voltage, wherein the second differential control voltage i) sets a capacitance of each varactor of the second varactor pair and ii) provides a second level of adjustment to the oscillation frequency of the oscillating signal, wherein the first and second levels of adjustment are different.

* * * * *